(12) United States Patent
Cadot et al.

(10) Patent No.: US 12,329,032 B2
(45) Date of Patent: Jun. 10, 2025

(54) METHOD FOR MANUFACTURING A LAYER OF TEXTURED ALUMINUM NITRIDE

(71) Applicant: COMMISSARIAT À L'ÉNERGIE ATOMIQUE ET AUX ÉNERGIES ALTERNATIVES, Paris (FR)

(72) Inventors: Stéphane Cadot, Grenoble (FR); François Martin, Grenoble (FR); Rémy Gassiloud, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 1103 days.

(21) Appl. No.: 17/126,580

(22) Filed: Dec. 18, 2020

(65) Prior Publication Data
US 2021/0193907 A1    Jun. 24, 2021

(30) Foreign Application Priority Data
Dec. 20, 2019 (FR) ........................... 1915272

(51) Int. Cl.
*H01L 41/319* (2013.01)
*C30B 23/02* (2006.01)
(Continued)

(52) U.S. Cl.
CPC ........... *H10N 30/079* (2023.02); *C30B 23/02* (2013.01); *C30B 23/025* (2013.01); *C30B 29/38* (2013.01);
(Continued)

(58) Field of Classification Search
CPC . C23C 14/024; C23C 14/0617; C23C 14/325; C23C 28/00; C23C 28/04;
(Continued)

(56) References Cited

U.S. PATENT DOCUMENTS 5,958,358 A * 9/1999 Tenne ..................... C30B 25/02
                                                     117/921
2015/0211112 A1   7/2015 Cadot et al.
(Continued)

FOREIGN PATENT DOCUMENTS

| CN | 107086175 A | * | 8/2017 | ........... C23C 14/165 |
| EP | 2899295 A1 | | 7/2015 | |

(Continued)

OTHER PUBLICATIONS

Hsu et al., Monolayer MoS2 Enabled Single-Crystalline Growth of AlN on Si(100) Using Low-Temperature Helicon Sputtering, ACS Appl. Nano Mater. 2019, 2, 1964-1969 (Year: 2019).*

(Continued)

*Primary Examiner* — Hua Qi
(74) *Attorney, Agent, or Firm* — Chrisman Gallo Tochtrop LLC

(57) ABSTRACT

Method for manufacturing a thin layer of textured AlN comprising the following successive steps: a) providing a substrate having an amorphous surface, b) forming a polycrystalline nucleation layer of $MS_2$ with M=Mo, W or one of the alloys thereof, on the amorphous surface of the substrate, the polycrystalline nucleation layer consisting of crystalline domains the base planes of which are parallel to the amorphous surface of the substrate, the crystalline domains being oriented randomly in an (a, b) plane formed by the amorphous surface of the substrate, c) depositing aluminum nitride on the nucleation layer, leading to the formation of a thin layer of textured AlN.

16 Claims, 4 Drawing Sheets

(51) Int. Cl.

| | |
|---|---|
| *C30B 29/38* | (2006.01) |
| *H01L 21/02* | (2006.01) |
| *H10H 20/01* | (2025.01) |
| *H10H 20/815* | (2025.01) |
| *H10H 20/82* | (2025.01) |
| *H10H 20/825* | (2025.01) |
| *H10N 30/00* | (2023.01) |
| *H10N 30/079* | (2023.01) |
| *H10N 30/853* | (2023.01) |

(52) U.S. Cl.
CPC .. *H01L 21/02422* (2013.01); *H01L 21/02458* (2013.01); *H01L 21/02513* (2013.01); *H01L 21/0254* (2013.01); *H10H 20/01335* (2025.01); *H10H 20/815* (2025.01); *H10H 20/82* (2025.01); *H10H 20/825* (2025.01); *H10N 30/708* (2024.05); *H10N 30/853* (2023.02)

(58) Field of Classification Search
CPC ..... C23C 28/042; C30B 23/02; C30B 23/025; C30B 29/38; H01L 21/02381; H01L 21/02422; H01L 21/02458; H01L 21/02485; H01L 21/02488; H01L 21/02502; H01L 21/02513; H01L 21/02516; H01L 21/0254; H01L 21/02573; H01L 21/02581; H01L 21/02609; H01L 21/02631; H01L 33/007; H01L 33/12; H01L 33/22; H01L 33/32; H10N 30/079; H10N 30/708; H10N 30/853

See application file for complete search history.

(56) References Cited

U.S. PATENT DOCUMENTS

2016/0079471 A1* 3/2016 Liao .................. C23C 16/303
438/47
2019/0326880 A1* 10/2019 Figueredo .............. H03H 9/173

FOREIGN PATENT DOCUMENTS

| WO | 2019168187 A1 | 9/2019 |
|---|---|---|
| WO | WO 219168187 A1 * | 9/2019 |

OTHER PUBLICATIONS

Zhao et al., Thickness-dependent photoelectric properties of MoS2/Si heterostructure solar cells, Scientific Reports vol. 9, Article No. 17381, 2019 (Year: 2019).*

Tang et al, Direct n- to p-Type Channel Conversion in Monolayer/Few-Layer WS2 Field-Effect Transistors by Atomic Nitrogen Treatment, ACS Nano 2018, 12, 2506-2513 (Year: 2018).*

Mughal et al, Effect of substrate on the growth and properties of MoS2 thin films grown by plasma-enhanced atomic layer deposition, J. Vac. Sci. Technol. A 37(1), Jan./Feb. 2019 (Year: 2019).*

Search Report for French application No. FR 1915272 dated Jul. 15, 2020.

Gupta, Priti et al. "Layered transition metal dichalcogenides: promising nearlattice-matched substrates for GaN growth" In: Scietific Reports, Mar. 3, 2016, pp. 1-8.

Hsu, Wei-Fan et al. "Monolayer MoS2 Enabled Single-Crystalline Growth of AlN on Si(100) Using Low-Temperature Helicon Sputtering" In: Applied Nanao Materials, 2019, vol. 2, pp. 1964-1969.

Ohunchi, "Fabrication of self-supporting AlN Film Subtrates by Van Der Waals Lift-Off" Report to Air Force Office of Scientific Research, University of Washington, Apr. 29, 1998. pp 1-49.

* cited by examiner

METHOD FOR MANUFACTURING A LAYER OF TEXTURED ALUMINUM NITRIDE

CROSS-REFERENCE TO RELATED APPLICATIONS

This application claims priority from French Patent Application No. 1915272 filed on Dec. 20, 2019. The content of this application is incorporated herein by reference in its entirety.

TECHNICAL FIELD

The present invention relates to the general field of thin layers of textured AlN.

The invention relates to a method for manufacturing such a layer.

The invention also relates to a stack able to be obtained by the method.

The invention is particularly advantageous since it makes it possible to manufacture a layer of highly textured AlN without needing to use a monocrystalline substrate.

The invention finds applications in numerous industrial fields, and in particular in the field of microelectronics and electronics.

PRIOR ART

The materials based on a nitride in column 13 of the periodic table (in particular AlN, GaN, InN and ternary compounds thereof) have particularly interesting properties (in particular good piezoelectric properties). For the past few years, they have been the subject of much research and have found applications in various fields such as power electronics, radio-frequency (RF) devices or light emitting diodes.

In the field of RF devices, it is a thin piezoelectric layer of aluminum nitride (AlN) that is used for converting acoustic waves into an electrical signal. In order to obtain high performance, this layer of AlN must be crystallized in its wurtzite form (hexagonal lattice), oriented (002) and highly textured (that is to say consisting of crystals strictly orientated in the same direction). It must therefore be deposited at a high temperature using epitaxy substrates such as monocrystalline sapphire ($\alpha$-$Al_2O_3$) or hexagonal silicon carbide (6H—SiC).

However, the use of such methods and/or the use of such substrates pose problems of compatibility with current methods and standards in the silicon industry.

In addition, the use of monocrystalline substrates leads to integration steps that are complicated and expensive, which may require a step of lifting off and transferring the thin layer of AlN, or a step of etching the monocrystalline substrate and then the integration of the electrodes by the rear face.

Another method consists of directly depositing the thin layer of AlN on an electrode that may cause a preferential orientation in the 002 plane of the AlN crystals. Such electrodes may for example be made from (110)-oriented polycrystalline molybdenum or (111)-oriented platinum.

However, the size of the crystals and the orientation thereof must be controlled so as to be reproducible, and the texture of the thin layers obtained on these polycrystalline electrodes is not as good as that obtained on monocrystalline sapphire or SiC substrates. In addition, the texture of the thin layer of AlN in proximity to the electrode is degraded, and it is necessary to form a very thick layer of AlN (typically greater than 500 nm) so as to obtain a satisfactory texture for RF applications. However, some applications, such as 5G, require higher frequencies, necessitating a reduction in the thickness of the AlN layers.

Recently, attention has been turned towards 2D materials, such as for example graphene, hexagonal boron nitride h-BN and transition metal dichalcogenides (TMDs), as a nucleation layer for the growth of the nitrides. In particular, TMDs such as $MoS_2$ or $WS_2$ are materials that are particularly promising for the growth of GaN and AlN since they have a lattice parameter close to these materials (1 to 3%).

However, it is accepted that, in order to form highly crystalline GaN or AlN on transition metal dichalcogenides, the nucleation layer of $MoS_2$ or $WS_2$ must also be highly crystalline.

For example, in the article by Gupta et al. ("*Layered transition metal dichalcogenides: promising nearlattice-matched substrates for GaN growth*", Scientific Reports | 6:23708 | DOI: 10.1038/srep23708), the nucleation layer is obtained by micromechanical exfoliation from monocrystals of $WS_2$ or $MoS_2$ followed by a step of transferring the exfoliated layer onto the growth substrate.

In the article by Hsu et al. ("*Monolayer $MoS_2$ Enabled Single-Crystalline Growth of AlN on Si(100) Using Low-Temperature Helicon Sputtering*", ACS Appl. Nano Mater. 2019, 2, 1964-1969), the growth of the layer of $MoS_2$ is carried out initially on sapphire, by CVD, then this layer is transferred onto a silicon substrate, by means of polymethylmethacrylate (PMMA). It is indicated that, after transfer, the highly oriented hexagonal lattice of the $MoS_2$ layer is preserved, which is essential for the subsequent growth of the nitride film.

In the document by Ohunchi ("*Fabrication of self-supporting AlN Film Substrates by Van Der Wools Lift-Off*", Final Report to Air Force Office of Scientific Research 1998), the layer of $WS_2$ is manufactured by vapor phase epitaxy using organometallic precursors (MOCVD) on a monocrystalline silicon substrate. Just before the deposition of the layer of $WS_2$, the substrate is etched with hydrofluoric acid in order to remove the layer of native oxide and to allow the epitaxial growth of the $WS_2$ on the silicon (this strategy moreover limiting the thermal budget applicable to the method because of the formation of tungsten silicide beyond 500° C.).

However, such methods cannot be used directly in a process of integration of devices without having to pass through expensive steps of transfer or integration of electrodes through the rear face of the substrate, or even are not compatible with large-scale production.

DISCLOSURE OF THE INVENTION

One of the aims of the present invention is to remedy the drawbacks of the prior art and in particular to propose a method for manufacturing a thin layer of textured AlN, of good quality, even at small thicknesses, the method having to be simple to implement and inexpensive.

For this purpose, the present invention proposes a method for manufacturing a thin layer of textured AlN comprising the following successive steps:

a) providing a substrate having an amorphous surface, b) forming a polycrystalline nucleation layer of $MS_2$ with M=Mo, W or one of the alloys thereof, on the amorphous surface of the substrate, the polycrystalline nucleation layer consisting of crystalline domains of $MS_2$ the (002) base planes of which are parallel to the amorphous surface of the substrate, the crystalline domains being oriented randomly in an (a, b) plane formed by the amorphous surface of the substrate, c) depositing aluminum nitride on the nucleation layer of $MS_2$, leading to the formation of a thin layer of textured AlN.

Randomly means that the crystalline domains are not oriented in the same way in the (a, b) plane. The crystalline domains do not have any preferential orientation.

The layer of AlN thus obtained has a hexagonal structure of the wurtzite type and grows following the crystalline orientation of the nucleation layer in order to form AlN crystals the 002 planes of which are strictly parallel to those of the nucleation layer.

Textured (or crystallographically oriented) means that the thin layer of AlN is formed by a multitude of crystals, all oriented in the same direction, at least to the scale of the active zone for the device sought, and possibly over the entire surface of the substrate.

The texturing is typically evaluated by X-ray diffraction using a rocking curve measurement obtained by varying the omega angular position around the Bragg position of the 002 plane of the AlN. The half-maximum width (FWHM) of the peak obtained makes it possible to quantify the texturing of the AlN layer.

The lower the value of this half-maximum width, the narrower the distribution of the orientation of the grains and the more improved is the crystalline quality: the film is said to be textured.

Highly textured means that the half-maximum width of the rocking curve of the 002 plane of the AlN is less than 2°, preferably less than 1° and even more preferentially less than 0.5°, for layers with a thickness greater than 50 nm.

The invention is fundamentally distinguished from the prior art by the growth of the layer of aluminum nitride on the layer of nanocrystalline $MS_2$, the crystalline domains of which are oriented randomly in the (a, b) plane formed by the surface of the substrate.

Against all expectations, the presence of this nanocrystalline nucleation layer oriented randomly in the (a, b) plane formed by the surface of the substrate allows the growth of a layer of AlN that is better textured than that obtained on a 110 molybdenum electrode, and as well textured as that obtained on $MoS_2$ crystals of micrometric size ideally formed on monocrystalline sapphire and all oriented in the same direction.

Counterintuitively, it therefore seems that the size of the crystalline domains constituting the layer of $MS_2$ does not play an essential role in the texture of the AlN film, and consequently that the nucleation of the AlN does not take place at the grain joints of the $MS_2$ layer, the random character of the configuration of the grain joints a priori not making it possible to induce a preferential orientation of the AlN crystals necessary for obtaining a textured AlN film.

In addition, such a layer of $MS_2$ may be directly formed on an amorphous substrate and serve both as a nucleation layer for the AlN and as a barrier to the etching, thus offering more possibilities in the integration strategy.

Advantageously, the M alloy of the nucleation layer of $MS_2$ contains up to 50% atomic one or more additional elements chosen from transition metals. The additional element or elements are added in a sufficiently small quantity not to critically impact on the lattice parameter of the $MS_2$ nucleation layer. Critically means, here and hereinafter, that the parameter of the crystalline lattice will not vary by more than 0.05 nm along the a and b axes so as not to alter the lattice parameter of the layer.

Advantageously, the nucleation layer of $MS_2$ has a thickness ranging from 0.6 nm to 50 nm, and preferably from 0.6 nm to 8 nm.

According to a first advantageous variant, step b) is performed at a temperature allowing the formation of a polycrystalline nucleation layer of $MS_2$ in a single step.

According to a second advantageous variant embodiment, step b) is performed in accordance with the following steps:
  depositing a layer of $MS_x$ with x greater than or equal to 2,
  annealing the layer of $MS_x$ under inert atmosphere at a temperature ranging from 450° C. to 1200° C. and preferably from 750° C. to 950° C., so as to form a polycrystalline layer of $MS_2$.

According to an advantageous third variant embodiment, step b), in order to form a layer of $MS_2$, is performed in accordance with the following successive steps:
  depositing a thin layer containing the metal or the M alloy in (pure) elementary form, or associated with one or more heteroatoms (for example in the form of an oxide, a nitride, a selenide or an oxysulfide),
  reactive thermal annealing in the presence of a volatile compound containing sulfur at a temperature ranging from 150° C. to 1200° C. and preferably from 350° C. to 750° C.,
  optionally, annealing under inert atmosphere at a temperature ranging from 450° C. to 1200° C. and preferably from 750° C. to 950° C., so as to form a polycrystalline nucleation layer of $MS_2$.

According to these three advantageous variant embodiments, the thin layers of $MS_2$ or $MS_x$ or the one containing the metal or the M alloy may be deposited, preferably, by chemical vapor deposition (CVD), by atomic layer deposition (ALD), by physical vapor deposition (PVD) or by cathodic sputtering ("RF sputtering").

Advantageously, the polycrystalline nucleation layer of $MS_2$ contains a doping element such as nitrogen, phosphorus, arsenic or antimony. The doping element is added in proportions not causing any alteration to the lattice parameters of the $MS_2$ compound greater than ±0.05 nm along the a and b axes.

Advantageously, step c) of depositing the thin layer of textured AlN is formed by physical vapor deposition or cathodic sputtering.

Advantageously, the thin layer of textured AlN has a thickness ranging from 1 nm to 1 μm.

Advantageously, the thin layer of textured AlN contains doping elements such as chromium, molybdenum, tungsten, scandium, yttrium or a lanthanide element. The doping elements are introduced in proportions not causing any alteration in the lattice parameters of the AlN greater than ±0.05 nm along the a and b axes.

Advantageously, the amorphous surface of the substrate is slightly rough. Rough means a roughness of less than 5 nm, preferably less than 1 nm, and even more preferentially less than 0.3 nm.

According to a particular embodiment, steps b) and c) can be repeated cyclically so as to obtain a stack comprising an alternation of nucleation layers of $MS_2$ and thin layers of textured AlN.

According to a first variant embodiment, the method includes an additional step, subsequent to step c), during which a stack comprising the polycrystalline $MS_2$ nucleation layer and the thin layer of textured AlN of the substrate is removed. This step may be performed, for example, by separating the stack from the substrate by mechanical liftoff using a transfer layer.

According to another variant embodiment, the method includes an additional step, subsequent to step c), during which the thin layer of textured AlN of the substrate and the $MS_2$ nucleation layer are separated.

These two variant embodiments may be performed by cleaving either to the substrate/nucleation layer interface or to the nucleation layer/thin layer of textured AlN interface if the nucleation layer adheres well to the substrate.

The method has numerous advantages:
being simple to implement,
not requiring the use of monocrystalline substrates,
allowing the formation of AlN with a highly textured column structure on an amorphous substrate, any type of substrate easily being able to be made amorphous on the surface or covered with a thin layer of an amorphous material,
allowing texturing of the AlN as from the first nanometers deposited and therefore the obtaining of layers of highly textured AlN having small thicknesses (typically having a thickness of less than 100 nm, or even less than 50 nm),
being able to function with extremely thin nucleation layers of $MS_2$ that will have only very little effect on the functioning of the final device,
being based on the use of a nucleation layer that is stable in air and moisture over several months, and not requiring any surface treatment before the growth of the AlN layer. It is therefore not necessary to concatenate under vacuum the deposition of the nucleation layer and the deposition of the AlN layer.

The invention also relates to a stack able to be obtained by the method as defined above, comprising, and preferably consisting successively of:
a thin layer of textured AlN,
a polycrystalline nucleation layer of $MS_2$ with M=Mo, W or one of the alloys thereof, the polycrystalline nucleation layer consisting of crystalline domains the (002) base planes of which are parallel to the stack, the orientation of the crystalline domains in an (a, b) plane formed by the stack being random,
optionally, a substrate having an amorphous surface, the polycrystalline nucleation layer of $MS_2$ being disposed between the substrate and the thin layer of textured AlN.

The thin layer of textured AlN is in direct contact with the nucleation layer of $MS_2$. In other words, there is no intermediate layer between the two layers.

The characteristics related to the method are also found in the stack formed at the end of the method.

The invention also relates to a microelectronic device, for example a radio-frequency (RF) device, an LED, a power device or a piezoelectric membrane, for example a piezoelectric acoustic membrane, comprising a stack as defined above.

The invention also relates to a microelectronic device, for example a radio-frequency (RF) device, an LED, a power device or a piezoelectric membrane comprising a thin layer of textured AlN.

Other features and advantages of the invention will emerge from the remainder of the following description.

It goes without saying that this remainder of the description is given only by way of illustration of the object of the invention and must under no circumstances be interpreted as a limitation of this object.

BRIEF DESCRIPTION OF THE DRAWINGS

The present invention will be understood better from a reading of the description of example embodiments given purely by way of indication and in no way limitatively, referring to the accompanying drawings, on which:

FIG. 5 is a graph showing the rocking curves of the 002 plane of the AlN, for a thin layer of AlN 100 nm thick deposited on a nucleation layer of $MoS_2$ 2 nm thick according to a particular embodiment of the method of the invention (denoted S1a), and for a thin layer of AlN 100 nm thick deposited on a reference sample comprising a textured electrode made from 110-oriented molybdenum (denoted ref 1).

FIG. 6 is a graph showing the change in the half-maximum width (FWHM) of the rocking curve of the 002 plane of the AlN measured by X-ray diffraction for samples of AlN of various thicknesses (5 nm to 100 nm) obtained in a nucleation layer of $MoS_2$ according to a particular embodiment of the method of the invention.

In order to afford better legibility, the various parts shown in the figures are not necessarily shown to the same scale.

DETAILED DISCLOSURE OF PARTICULAR EMBODIMENTS

Figure 1A:
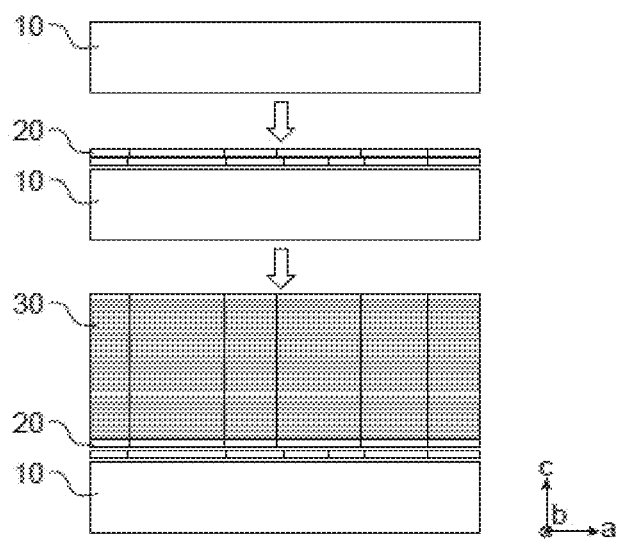
FIGS. 1A, 1B and 1C show, schematically, various steps of various methods for manufacturing a thin layer of textured AlN according to various particular embodiments of the invention.
Figure 1B:
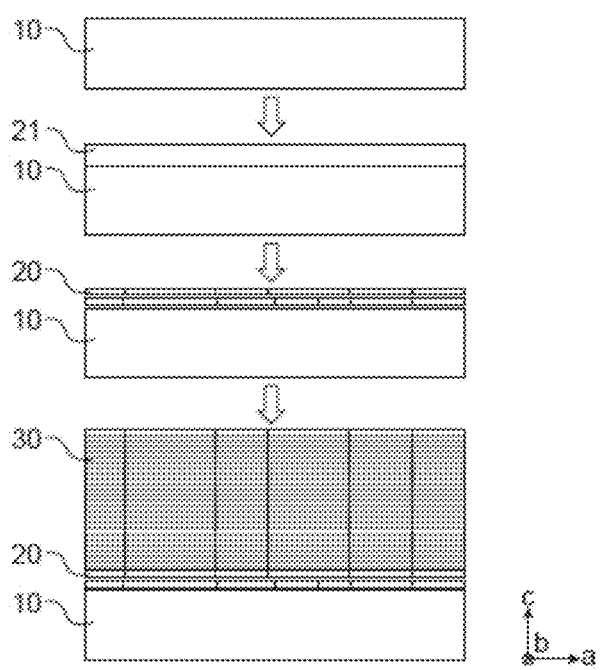
Figure 1C:
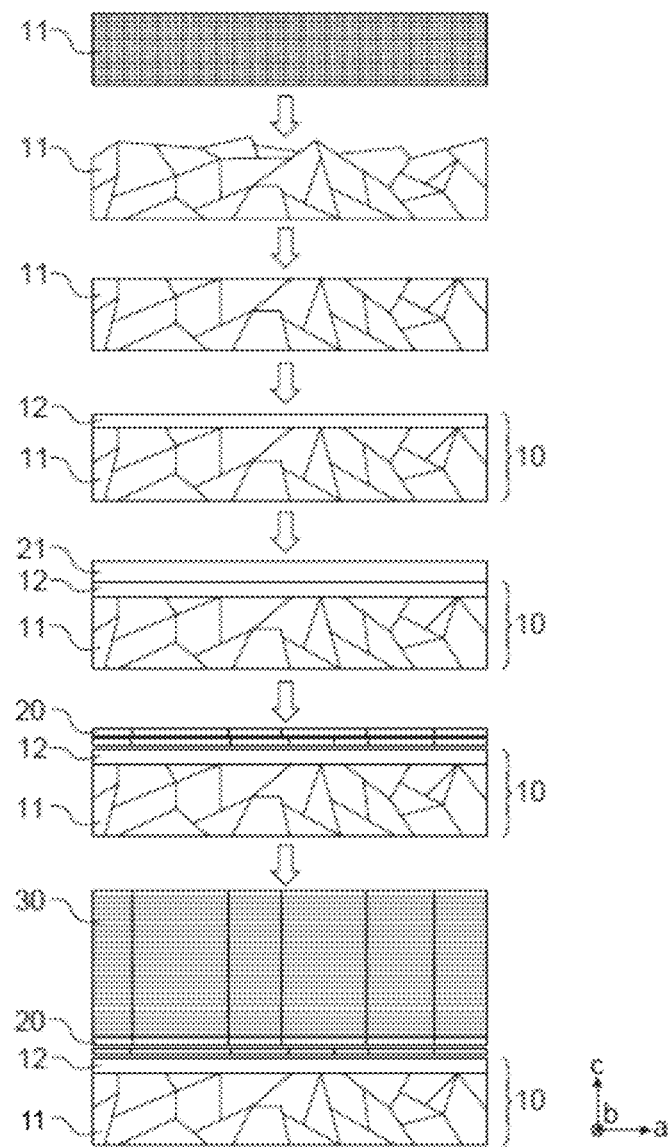

Reference is made first of all to FIGS. 1A, 1B, and 1C.
The method for manufacturing a layer of textured AlN includes at least the following successive steps:
a) providing a substrate 10 having an amorphous surface,
b) forming a polycrystalline layer 20 of $MS_2$ with M=Mo, W or one of the alloys thereof, on the amorphous surface of the substrate 10, the polycrystalline nucleation layer 20 comprising crystalline domains the (002) base planes of which are parallel to the surface of the substrate 10, the crystalline domains being oriented randomly in the (a, b) plane formed by the amorphous surface of the substrate 10,
c) depositing AlN on the nucleation layer 20, making it possible to obtain a layer of textured AlN 30.

Preferably, the substrate 10 meets one or more of the following criteria, taken alone or in combination:
being amorphous, at least on the surface,
being thermally stable up to the highest temperature of the method, without alteration of the surface roughness thereof,
being flat, being only slightly rough, with a mean roughness (Rq) advantageously less than 5 nm, preferably less than 1 nm, and even more preferentially less than 0.3 nm, having barrier properties with respect to the diffusion of the elements constituting the nucleation layer 20 up to the highest temperature used using the various steps of the method.

According to a first variant embodiment, the substrate 10 is an amorphous material (FIGS. 1A and 1B).

According to a second variant embodiment, the substrate 10 includes a support 11 that may be a polycrystalline material covered by an amorphous thin layer 12 (FIG. 1C).

This is for example the case when the support 11 is a crystalline material oxidizing spontaneously in air, and on the surface of which a layer of oxide forms naturally.

For example, for a support 11 of AlN, a superficial layer of amorphous $Al_2O_3$ forms spontaneously in air. In the case of silicon, a layer of amorphous $SiO_2$ forms spontaneously.

By way of illustration, a sheet or wafer of silicon including a superficial thin layer 12 of $SiO_2$ can be chosen as the substrate 10.

Alternatively, it is possible to deposit an amorphous thin layer 12 on the support 11, preferably a layer of oxide or nitride remaining amorphous at high temperature, such as $SiO_2$, $Al_2O_3$ or $SiN_x$. This embodiment is advantageous, in the case where the support 11 does not oxidize spontaneously in an oxidizing atmosphere (such as air) and/or in the case where the support 11 does not have satisfactory barrier properties in respect of the diffusion of the elements constituting the nucleation layer 20. Such an amorphous layer may for example be deposited by PVD or by CVD or ALD plasma-assisted or not, or formed by reactive thermal annealing of the substrate (i.e. in oxidizing or nitriding atmosphere).

Alternatively, the surface of the polycrystalline support 11 may be made amorphous by a plasma treatment.

If the substrate 10 is not thermally stable up to the highest temperature of the method (for example if the substrate risks crystallizing at high temperature or is already polycrystalline but has a risk of modification of the density and/or of the morphology of at least part of the crystalline domains of which it consists during the method), a step of thermal annealing may be applied in order to stabilize the substrate 10. Preferably, the temperature chosen will ideally be higher than the highest temperature used during the following steps of the method.

If the surface of the substrate 10 has an excessively high roughness, this may be reduced by polishing, for example chemical mechanical polishing (CMP).

The substrate 10 may be etched locally.

During step b), a thin nucleation layer 20 is formed. The nucleation layer 20 may also be referred to as a seeding layer, germination layer or texturing layer.

The nucleation layer 20 is based on one or more transition metal dichalcogenides (also known by the acronym TMD or TMDC, standing for "transition metal dichalcogenide") or based on one of the alloys thereof.

Preferably, the nucleation layer 20 has the general formula:

$MS_x$ with M tungsten, molybdenum or one of the alloys thereof, x ranging from 1.4 to 2.2 and preferably from 1.8 to 2.1, and even more preferentially x being equal to 2.

It should be noted that these variations in x do not call into question the crystallographic nature of the nucleation layer $MS_2$, and may simply be related to localized structural defects, to the composition of the borders of the crystalline domains or of the grain joints, or to the way in which the nucleation layer is bonded with the surface of the substrate.

Even more preferentially, the nucleation layer 20 is made from $MoS_x$ or $WS_x$.

The alloy may comprise, for example, up to 50% atomic one or more additional elements. The additional element or elements will be chosen so that the lattice parameter is not altered critically along the a and b axes. These additional elements may include, non-limitatively, transition metals (such as those in columns 4, 5 and 6 of the periodic table), such as for example vanadium, niobium, tantalum, titanium or chromium. For example, M may be an alloy of molybdenum and tungsten which may contain the inclusion of metals such as vanadium or niobium.

Impurities may also be present in the nucleation layer 20. The impurities may come for example from the diffusion of metals or heteroatoms of the substrate 10. The impurities are in particular present in depth in the nucleation layer, in particular at the interface of the substrate 10 and nucleation layer 20. For example, a 2 nm layer of $MoS_2$ formed on amorphous $SiN_x$ may be nitrided at the $SiN_x/MoS_2$ interface. The surface of the nucleation layer 20 on which the AlN layer 30 will grow is preserved.

Dopants such as nitrogen, phosphorus, arsenic or antimony may be introduced by implantation or reactive annealing of the nucleation layer 20. In the same way as for the additional elements that may be associated with the metal M, the quantity of these doping elements should not critically alter the lattice parameter of the nucleation layer 20 of $MS_2$ along the a and b axes.

Figure 3:
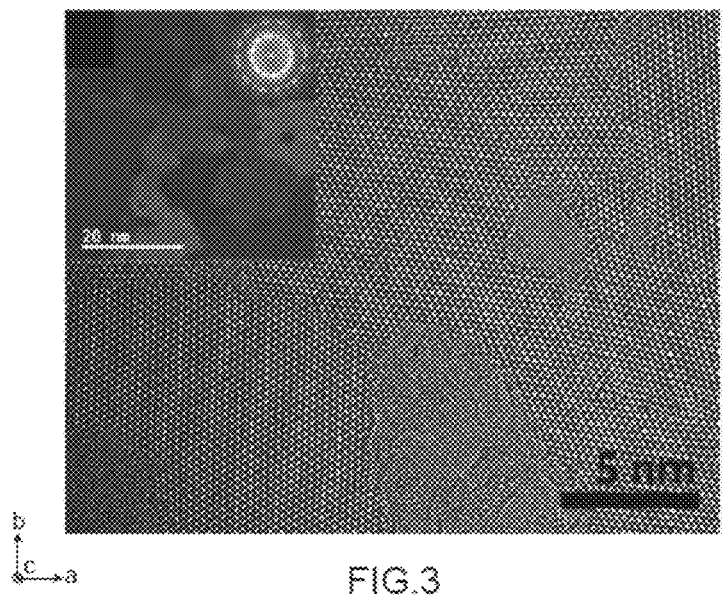
FIG. 3 is a view in the plane obtained by transmission electron microscopy (TEM) of a thin layer of $MoS_2$ 0.6 nm thick (a monolayer), obtained according to a particular embodiment of the method according to the invention, and transferred onto a TEM grid. The insert is a photograph obtained by diffraction of the electrons with mapping of the orientation of the crystalline domains.

The nucleation layer 20 is formed by crystalline domains the (002) base planes of which are parallel to the surface of the substrate 10, i.e. to the (a, b) plane. The crystalline domains have a random orientation in the (a, b) plane formed by the surface of the substrate (FIG. 3).

Advantageously, the crystals of the layer of $MS_2$ have a largest dimension of between 1 and 100 nm, preferably between 5 and 50 nm.

The thickness of the nucleation layer 20 ranges from 0.6 nm (that is to say the equivalent of a monolayer), i.e. a single foil of $MS_2$) to 50 nm, and preferably from 0.6 to 12 nm, even more preferentially from 0.6 nm to 8 nm.

Beyond a few tens of nanometers, for example beyond 20 nm or 50 nm, or even beyond 80 nm for some substrates, the (002) base planes of the crystals forming the nucleation layer 20 of $MS_2$ have a tendency to be no longer strictly parallel to the surface of the substrate and are therefore not suitable for the growth of a layer 30 of highly textured AlN. Disorientation increases with the thickness and is dependent on the substrate. In general, the finer the nucleation layer 20 of $MS_2$, the better will be the texturing of the layer 30 of AlN. The thickness of the layer 20 of $MS_2$ will be chosen according to the nature of the substrate 10 and the application sought.

The nucleation layer may be deposited by chemical vapor deposition (CVD), by atomic layer deposition (ALD), by physical vapor deposition (PVD) or by cathodic sputtering ("RF sputtering").

The growth of the nucleation layer 20 may be direct or indirect.

According to a first variant embodiment, the growth of the nucleation layer 20 is direct, that is to say a single step suffices to obtain a layer of $MS_x$ with x equal to 2 (FIG. 1A).

For example, such a growth may be produced using these deposition methods at sufficiently high temperatures to allow crystallization of the compound $MS_2$ allowing the formation of the nucleation layer 20 (typically above 500° C.).

According to a second variant embodiment, shown in FIGS. 1B and 1C, the growth of the nucleation layer 20 is indirect, that is to say the growth step is performed in a plurality of steps (at least two).

Typically, these various steps consist successively in:
- depositing a thin layer 21 containing at least the transition metal or metals of the final nucleation layer 20,
- performing one or more post treatments leading to the formation of a nucleation layer 20 of formula $MS_2$ having satisfactory crystalline properties.

According to a first indirect growth alternative, the thin layer 21 deposited contains both the transition metal or metals and sulfur, with a sulfur/metal atomic ratio (denoted S/M) greater than or equal to 2 (i.e. x is greater than or equal to 2). Such a layer is for example obtained when the temperature during deposition is not sufficiently high to allow crystallization of the compound $MS_2$ allowing the formation of the nucleation layer 20 (typically below 450° C.), and in the presence of a sulfur-rich compound (for example elementary sulfur, polysulfides or 1,2-ethanedithiol).

The post-treatment consists of performing a thermal annealing under inert conditions (under ultra-high vacuum or inert gas for example) in order simultaneously to cause the crystallization of the compound $MS_2$ and to evaporate the excess sulfur.

The annealing temperatures advantageously range from 450° C. to 1200° C., preferentially from 750° C. to 1000° C. and even more preferentially from 750° C. to 950° C. The duration of an annealing at a temperature above 950° C. will be sufficiently short not to damage the nucleation layer 20. The duration of annealing will be chosen according not only to the temperature but also to the nature of the annealing (standard thermal annealing, rapid thermal treatment (RTP) or laser beam annealing).

According to a second indirect growth alternative, the thin layer 21 deposited:
- does not contain any sulfur (for example the thin layer deposited 21 is an oxide, a nitride, a selenide or an oxysulfide of the metal or metals M), or
- contains an insufficient quantity of sulfur: the S/M atomic ratio is strictly less than 2.

According to this second indirect growth alternative, the post-treatment is a thermal annealing carried out in the presence of an element containing sulfur in order to be able to form a nucleation layer 20 having satisfactory crystalline properties. For example, this step is performed under a flow of hydrogen sulfide ($H_2S$) or of an organosulfur compound, advantageously diluted in an inert gas, or in the presence of elementary sulfur.

According to a particular embodiment, hydrogen may be added in order to limit the formation of carbon (resulting from the thermal decomposition of the organosulfur compounds) or of elementary sulfur (resulting from the polymerization of the hydrogen sulfide).

The organosulfur compound may be chosen from thiols, polysulfides or derivatives of the silathiane type (such as hexamethyldisilathiane).

According to a first advantageous variant, organosulfur compounds having short aliphatic chains (typically having from 1 to 4 carbon atoms) will be chosen.

According to a particular embodiment, the sulfur compound may be devoid of carbon. A volatile compound such as $H_2S$, $H_2S_2$ or $S_2Cl_2$ will advantageously be chosen. The use of this type of sulfur compound makes it possible in particular to avoid contaminating the nucleation layer with carbon.

The temperatures during sulfuration range, for example, from 150° C. to 1200° C., preferentially from 350° C. to 750° C. This sulfuration step may be followed by a step of thermal annealing in an inert atmosphere. The conditions of the thermal annealing are for example those described for the first alternative of the indirect growth.

A slight variation in the stoichiometry of the nucleation layer 20 or of the layer 21 after sulfuration (i.e. $MS_x$ with x<2) may be related to the states of interface with the substrate or to the presence of structural defects, as mentioned previously, but also to the formation of a superficial layer of oxide, for example when it is exposed to ambient air if it has not been deposited, sulfurated, or annealed at a sufficiently high temperature to be stable in air (i.e. T°<650° C.). In the case where this $MS_x$ layer does not contain metals other than molybdenum and tungsten, this problem of surface oxidation can be eliminated by a simple thermal annealing in inert atmosphere at a temperature above 650° C., which allows elimination of the molybdenum and/or tungsten oxides by evaporation and the obtaining of a thin nucleation layer 20 of $MS_2$ devoid of oxygen and having satisfactory crystalline properties.

According to a particular embodiment, not shown, a thin encapsulation layer may be deposited on the thin layer 20 or 21, in order to preserve the integrity thereof when the final thermal annealing is carried out at particularly high temperatures (above 950° C.). Before the deposition of this encapsulation layer, it is necessary to ensure that the S/M ratio in the thin layer 20 or 21 is as close as possible to 2 by applying a suitable sulfuration and/or annealing sequence, since an excessively high quantity of sulfur may lead to delamination of the encapsulation layer, and an excessively low quantity to the formation an $MS_x$ layer not having the expected structure.

The encapsulation layer consists of a material that is chemically inert with respect to the nucleation layer 20 at the temperature used for annealing. By way of illustration and non-limitatively, the encapsulation layer may be a metal oxide ($Al_2O_3$, $SiO_2$, $TiO_2$, $ZrO_2$, $HfO_2$, $VO_2$, $Ta_2O_5$) or a metal nitride (AlN, $SiN_x$, $TiN_x$, $ZrN_x$, $HfN_x$, $VN_x$, $TaN_x$).

This encapsulation layer is next selectively eliminated before the deposition of the layer of AlN, for example by a non-oxidizing wet etching method. The etching solution comprises for example hydrofluoric acid, soda, potash or ammonia.

During step c), the layer 30 of textured aluminum nitride is formed.

The layer 30 of AlN has a hexagonal structure of the wurtzite type and has a column structure composed of crystals strictly oriented in the same direction along the axis c orthogonal to the (a, b) plane formed by the surface of the substrate. The 002 crystalline planes of the AlN crystals constituting the layer 30 are strictly parallel to the (a, b) plane and to the 002 planes of the crystalline domains constituting the nucleation layer 20 of $MS_2$.

The degree of texturing can be estimated, for example, by X-ray diffraction using a rocking curve measurement obtained by varying the omega angular position around the Bragg position of the 002 plane of the AlN. The half-maximum width (FWHM) of the peak obtained makes it possible to quantify the texturing (or in other words the degree of disorientation of the crystals) of the layer of AlN.

Highly textured (that is to say having only a slight disorientation of the crystals) means that the half-maximum width of the rocking curve of the plane 002 of the AlN is less than 2°, preferably less than 1° and even more preferentially less than 0.5° for layers of AlN the thickness of which is greater than 50 nm.

The deposition of the layer of AlN is preferably performed as a temperature lying between ambient temperature (typically 20° C.) and 400° C., preferably between 300° C. and 350° C., which makes it possible not to damage the layer of $MS_2$ and thus avoids causing defects in the layer of AlN.

The deposition of the textured layer 30 of AlN on the nucleation layer 20 of $MS_2$ can be implemented using various techniques such as PVD, cathodic sputtering, pulsed laser deposition (PLD), CVD and ALD. The deposition parameters and the temperature will be chosen so as to form a layer 30 of AlN that is crystalline in its hexagonal form (wurtzite).

Preferably, the layer 30 of AlN is deposited by PVD. This embodiment is particularly advantageous for RF applications since this deposition technique makes it possible to form thick layers (generally with a thickness greater than 100 nm) in a short time.

Preferably, the thickness of the layer 30 of AlN ranges from 1 nm to a few microns and even more preferentially from 1 nm to 1 µm. According to the applications sought, it will be possible to choose a slight thickness, for example from 1 nm to 100 nm, or a great thickness, for example from 100 nm to 1 µm.

In a particularly advantageous variant embodiment, the thickness of the layer of AlN is between 1 nm and 300 nm. Preferably, the thickness is less than or equal to 200 nm and even more preferentially less than or equal to 100 nm. Such thicknesses avoid delamination of the AlN/$MoS_2$ stack of the substrate.

The intrinsic stress in the layer 30 of AlN plays a critical role in the mechanical strength thereof. High stress values may not only cause delamination of the layer 30 of AlN because of the absence of covalent bonds between each lamella constituting the nucleation layer 20 of $MS_2$, as well as at the interfaces between the nucleation layer 20 and the materials situated on either side of this layer (i.e. the substrate/$MS_2$ interfaces on the one hand and $MS_2$/AlN on the other hand), but may also have a negative impact on the texture of the layer 30 of AlN because of the formation of dislocations.

According to a particular embodiment, a bias may be applied to the substrate 10 during the deposition of the layer 30 of AlN, in particular in the case of a deposition by PVD, in order to reduce the mechanical stress in the layer 30 of AlN and consequently to be able to increase the critical thickness at which the layer 30 of AlN will begin to delaminate. This bias can advantageously be applied after the deposition of a few nanometers of AlN in order to avoid damaging the surface of the nucleation layer 20.

According to another variant embodiment, prior to the deposition of the layer 30 of AlN, a localized etching of the layer 20 of $MS_2$ is carried out, so as to make certain regions of the substrate 10 locally accessible. These regions of the substrate 10 that are not covered by the layer 20 of $MS_2$ serve as an anchoring point for the layer 30 of AlN. Delamination of the layer 30 of AlN can thus be avoided by improving the adhesion between the AlN/$MS_2$ stack and the substrate 10. The localized etching may for example be performed by standard lithography techniques.

The layer 30 of AlN may contain doping agents such as transition metals or rare earths, in order to adjust the piezoelectric properties of the AlN and/or to modify the lattice parameters thereof, for example to make it possible to reduce the lattice mismatch between the AlN and the $MS_2$ constituting the nucleation layer. Such doping agents may for example be chosen alone or in combination, from the group comprising chromium, molybdenum, tungsten, scandium, yttrium and the other lanthanides, in proportions not causing any alteration in the lattice parameters of the AlN greater than ±0.05 nm along the axes a and b.

According to a particular embodiment, the steps b) and c) are repeated cyclically in order to obtain an alternation of nucleation layers 20 of $MS_2$ and layers 30 of textured AlN. This particular embodiment can for example make it possible to relax the stresses in each layer 30 of AlN and thus to limit the formation of dislocations and/or the delamination of the layers 30 of AlN.

Figure 2:
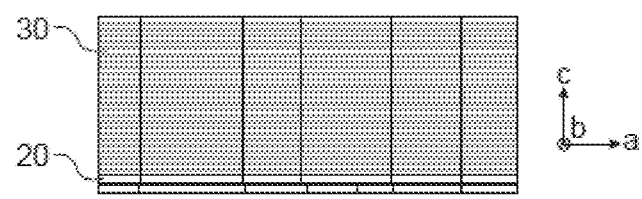
FIG. 2 shows, schematically, and in cross section, a stack formed by a polycrystalline nucleation layer of $MS_2$ and a thin layer of textured AlN, according to a particular embodiment of the invention.

The invention also relates to a stack able to be obtained by the method as defined previously comprising, and preferably consisting successively of (FIG. 2):
  a thin layer (30) of textured AlN,
  a polycrystalline nucleation layer (20) of $MS_2$.

The stack may further comprise the substrate 10 as described previously.

The orientation of the crystalline domains is random in an (a, b) plane parallel to the stack.

The thin layer 30 of textured AlN alone or with the polycrystalline nucleation layer 20, in the form of a stack, is particularly advantageous for manufacturing microelectronic and/or electronic devices.

Although this is in no way limitative, the invention finds applications in numerous fields, and in particular it can be used in the field of RF devices and more particularly RF filters, light emitting diodes (LEDs), acoustic resonators or any other device requiring the use of the piezoelectric membrane, having in particular a thickness of less than 100 nm. It can also be used indirectly, as deposited or after transfer onto another substrate. In the case of a transfer involving a turning over of the AlN/$MS_2$ stack, the nucleation layer 20 of $MS_2$ may be eliminated or kept. It may then serve as a passivation layer for the AlN, or as a nucleation layer for the growth of another material.

Illustrative and Non-Limitative Examples of Particular Embodiments:

In this example, the substrate 10 is a silicon wafer 11 covered with an amorphous layer 12 of $SiO_2$ 500 nm thick obtained by thermal oxidation. A thin layer 20 of $MoS_2$ 2 nm thick (that is to say approximately 3 monolayers) is obtained by ALD at 100° C. by alternately injecting two precursors: $Mo(NMe_2)_4$ and 1,2-ethanedithiol. The parameters used are, for example, those described in the document EP 2 899 295 A1. The deposit obtained is then sulfurated at 450° C. for 5 minutes under a flow of nitrogen of 200 NmL/min containing 4% hydrogen and 0.5 torr of di-tert-butyl disulfide vapor, followed by rapid heat treatment at 950° C. under a flow of argon for 5 minutes.

A layer 30 of AlN 100 nm thick is finally deposited on the layer 20 of $MoS_2$ by cathodic sputtering (RF power: 2 kW, temperature of substrate: 350° C.).

Figure 4A:
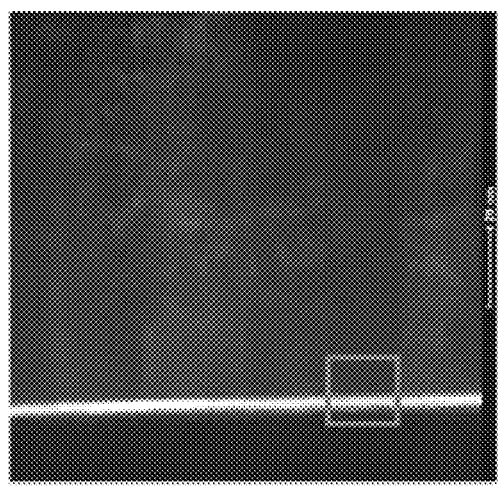
FIGS. 4A and 4B are photographs obtained by transmission electron microscopy on a cross section of a stack comprising an amorphous $SiO_2$ substrate, a polycrystalline nucleation layer of $MoS_2$ 2 nm thick and a 100 nm layer of AlN, at various magnification factors.
Figure 4B:
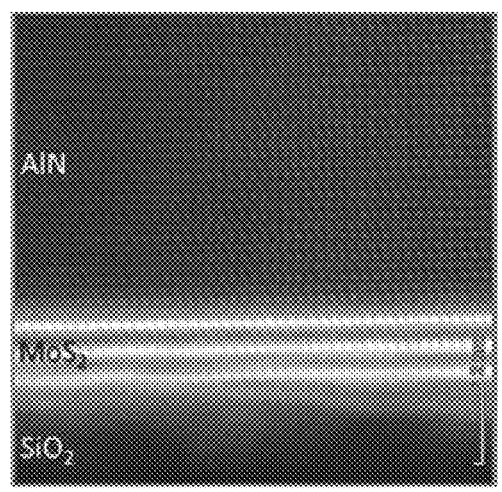
Figure 4C:
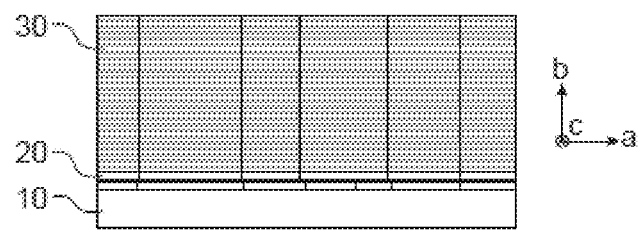
FIG. 4C shows schematically the stack, obtained according to a particular embodiment of the invention, observed in FIGS. 4A and 4B.

An STEM observation of the sample in cross section confirms the presence of three $SiO_2$/$MoS_2$/AlN layers and the columnar growth of the layer 30 of AlN (FIGS. 4A, 4B+diagram in FIG. 4C). Observation of the $SiO_2$/$MoS_2$/AlN interfaces at very high resolution confirms the epitaxial growth of the AlN crystals on the crystalline domains of $MoS_2$ of the nucleation layer 20, as well as the absence of diffusion at the AlN/$MoS_2$ interface. A slight diffusion of molybdenum is observed in the $SiO_2$ substrate, but does not affect the quality of the surface monolayer of the $MoS_2$, which is the one causing the texturing of the AlN.

The texture of the layer 30 of AlN is evaluated by X-ray diffraction using a rocking-curve measurement obtained by varying the omega angular position around the Bragg position of the 002 plane of the AlN. The curve (omega scan) obtained is shown in FIG. 5.

The value of the half-maximum width (FWHM) of the rocking curve for this layer of 100 nm of AlN on $MoS_2$ is 0.43°, which is close to the best values normally obtained with layers of AlN the growth of which was effected at very high temperature on monocrystalline sapphire substrates.

By way of comparison, a layer of AlN with a similar thickness (100 nm) was deposited, with the same parameters:
directly on $SiO_2$, which leads to a half-maximum width of the rocking curve of 4.18°,
on a highly textured 110-oriented molybdenum electrode (which is a reference for the manufacture of RF filters), which leads to a half-maximum width of the rocking curve of 2.57° (FIG. 5).

The influence of the thickness of the layer 30 of AlN on the texturing thereof was evaluated for thicknesses of between 5 nm and 100 nm, all the other parameters (substrate and nature of the layer 20 of $MoS_2$) being kept identical (FIG. 6). The results obtained indicate half-maximum width values of the rocking curve of less than 1° for layers of AlN only 25 nm thick, and less than 0.5° for layers of AlN with thicknesses greater than 50 nm, revealing an ability of the method that is the object of the invention to texture extremely thin layers of AlN (typically less than 100 nm) fat superior to what has been reported up until present in the literature.

The invention claimed is:

1. A method for manufacturing a film of textured AlN comprising the following successive steps:
   a) providing a substrate having an amorphous surface,
   b) forming a polycrystalline nucleation layer of $MS_2$ with M=Mo or W or one of the alloys thereof, on the amorphous surface of the substrate, the polycrystalline nucleation layer consisting of crystalline domains having base planes, the base planes being parallel to the amorphous surface of the substrate, the crystalline domains being oriented randomly in an (a, b) plane formed by the amorphous surface of the substrate, the crystalline domains not being oriented in a same way in the (a, b) plane,
   c) depositing aluminum nitride on the polycrystalline nucleation layer, leading to formation of the film of textured AlN which grows following a crystalline orientation of the polycrystalline nucleation layer in order to form the film of textured AlN having base planes parallel to the base planes of the polycrystalline nucleation layer.

2. The method according to claim 1, wherein M of the polycrystalline nucleation layer of $MS_2$ contains up to 50% atomic one or more additional elements chosen from transition metals selected from vanadium, niobium, tantalum, titanium and chromium.

3. The method according to claim 1, wherein the polycrystalline nucleation layer has a thickness ranging from 0.6 nm to 50 nm.

4. The method according to claim 1, wherein step b) is performed at a temperature allowing the formation of the polycrystalline nucleation layer of $MS_2$ in a single step.

5. The method according to claim 1, wherein step b) is performed in accordance with the following successive steps:
   depositing a layer of $MS_x$ with x greater than or equal to 2,
   annealing the layer of $MS_x$ under inert atmosphere at a temperature ranging from 450° C. to 1200° C. so as to form the polycrystalline nucleation layer of $MS_2$.

6. The method according to claim 1, wherein step b) is performed in accordance with the following successive steps:
   depositing a film containing M in elementary form or associated with one or more heteroatoms,
   reactive thermal annealing in the presence of a volatile compound containing sulfur at a temperature ranging from 150° C. to 1200° C.,
   optionally, annealing under inert atmosphere at a temperature ranging from 450° C. to 1200° C. so as to form the polycrystalline nucleation layer of $MS_2$.

7. The method according to claim 1, wherein the polycrystalline nucleation layer of $MS_2$ contains a doping element selected from nitrogen, phosphorus, arsenic or antimony.

8. The method according to claim 1, wherein step c) of depositing the film of the textured AlN is performed by physical vapor deposition or cathodic sputtering.

9. The method according to claim 1, wherein the film of the textured AlN has a thickness ranging from 1 nm to 1 μm.

10. The method according to claim 1, wherein the film of the textured AlN contains doping elements selected from chromium, molybdenum, tungsten, scandium, yttrium or an element of the lanthanides.

11. The method according to claim 1, wherein the amorphous surface of the substrate has a roughness of less than 5 nm.

12. The method according to claim 1, including an additional step, subsequent to step c), during which a stack comprising the polycrystalline nucleation layer of $MS_2$ and the film of the textured AlN is removed from the substrate.

13. The method according to claim 1, wherein the the polycrystalline nucleation layer of $MS_2$ has crystals which have a maximum dimension of between 1 nm and 100 nm.

14. The method according to claim 1, wherein step c) of depositing aluminum nitride on the polycrystalline nucleation layer to form the film of the textured AlN is performed at a temperature of between 20° C. and 400° C.

15. A microelectronic device comprising the film of the textured AlN obtained by the method according to claim 1.

16. The microelectronic device according to claim 15, wherein the microelectronic device is a radio-frequency device, an LED, a power device or a piezoelectric membrane.

* * * * *